United States Patent
Kuo et al.

(10) Patent No.: US 7,617,353 B2
(45) Date of Patent: Nov. 10, 2009

(54) FLASH MEMORY CIRCUIT FOR SUPPORTING AN IDE APPARATUS

(75) Inventors: Lung-Yi Kuo, Taichung Hsien (TW); Yung-Hao Chang, Jhubei (TW)

(73) Assignee: Silicon Motion Inc., Guangdong (CN)

( * ) Notice: Subject to any disclaimer, the term of this patent is extended or adjusted under 35 U.S.C. 154(b) by 697 days.

(21) Appl. No.: 11/334,428

(22) Filed: Jan. 19, 2006

(65) Prior Publication Data

US 2007/0168599 A1    Jul. 19, 2007

(51) Int. Cl.
  *G06F 12/00*   (2006.01)
  *G06F 13/00*   (2006.01)
  *G06F 13/28*   (2006.01)
(52) U.S. Cl. ...................................... 711/103
(58) Field of Classification Search ................... 711/103
   See application file for complete search history.

(56) References Cited

U.S. PATENT DOCUMENTS 6,507,881 B1 *    1/2003   Chen ........................... 710/305
6,778,436 B2 *    8/2004   Piau et al. ............... 365/185.03
2004/0049627 A1   3/2004   Piau et al.
2007/0124525 A1 * 5/2007   Shen et al. .................. 710/305
2007/0208900 A1 * 9/2007   Tee et al. .................... 710/315

FOREIGN PATENT DOCUMENTS

TW    426851      3/2001
TW    M280495     11/2005

* cited by examiner

*Primary Examiner*—Sheng-Jen Tsai
(74) *Attorney, Agent, or Firm*—Muncy, Geissler, Olds & Lowe, PLLC

(57) ABSTRACT

The present invention provides a flash memory circuit for accessing an IDE apparatus. This flash memory circuit includes a flash memory controller, a latch circuit and an IDE apparatus. The flash memory controller outputs a latch signal to control the latch circuit to access a special address signal and output a RD/WR signal. The RD/WR signal is used to access data from the IDE apparatus according to the special address signal.

16 Claims, 2 Drawing Sheets

FLASH MEMORY CIRCUIT FOR SUPPORTING AN IDE APPARATUS

FIELD OF THE INVENTION

The present invention is related to a flash memory circuit, and more particularly to a flash memory circuit for supporting an IDE apparatus.

BACKGROUND OF THE INVENTION

Flash memory is a non-volatile memory, so stored data is not erased when it is powered off. Moreover, the stored data can be changed instantly and can typically be changed from thousands to tens of thousands of times in a flash memory's lifetime. Hence, flash memory has been popularly used in many electrical devices for storing data due to these factors plus its increasingly low price.

There are a lot of storage mediums today. However, the access interfaces of these storage mediums are often not compatible with each other. For example, the access interface of flash memory cannot be used to access IDE memory. Therefore, when a flash memory and an IDE memory are together used in an electrical device, it is necessary to form two access circuits for accessing the two different memories, which increases the cost and the volume of the electrical device.

Therefore, an access circuit that can access flash memory and IDE memory together is desired.

SUMMARY OF THE INVENTION

The main purpose of the present invention is to provide a flash memory circuit that can also access IDE memory.

Another purpose of the present invention is to provide an access circuit that can access the flash memory and the IDE memory together.

According to the foregoing purposes, the present invention provides a flash memory circuit that can also access an IDE apparatus. This flash memory circuit includes a flash memory controller, a latch circuit and an IDE apparatus. The flash memory controller outputs a latch signal to control the latch circuit to access a special address signal and output a RD/WR signal. The RD/WR signal is used to access data according to the special address signal.

In an embodiment, the present invention provides a method of using a flash memory circuit to access an IDE apparatus. First, a latch signal is enabled by a flash memory controller to activate a latch circuit to latch a special address signal. Next, the latch signal is disabled to latch the special address signal in the latch circuit. Finally, the data in the IDE apparatus is accessed according to the address signal in the latch circuit.

In another embodiment, the present invention provides a direct memory access method for an IDE apparatus. First, conditions in a firmware are set. The clock signals for accessing the IDE apparatus and accessing the flash memory are set to be the same. A special accessing number and address are set for accessing data. When accessing, a latch signal is enabled for setting the special address in a latch circuit. Then, the latch signal is disabled to latch the special address in the latch circuit. Finally, a flash memory controller can access the IDE apparatus according to the set accessing number and the address.

BRIEF DESCRIPTION OF THE DRAWINGS

The foregoing aspects and many of the attendant advantages of this invention are more readily appreciated and better understood by referencing the following detailed description, when taken in conjunction with the accompanying drawings, wherein.

DETAILED DESCRIPTION OF THE PREFERRED EMBODIMENT

In a NAND-type flash memory, the data and address lines use the same bus. Therefore, the data can be serially accessed. However, in an IDE apparatus, the data and the address lines are separated. Therefore, the data cannot be serially accessed. In other words, when an electrical device has IDE memory and flash memory, different access circuits must be used to access different memories. The purpose of the present invention is to provide an access circuit to concurrently access these two memories. The following is an embodiment of the present invention.

Figure 1:
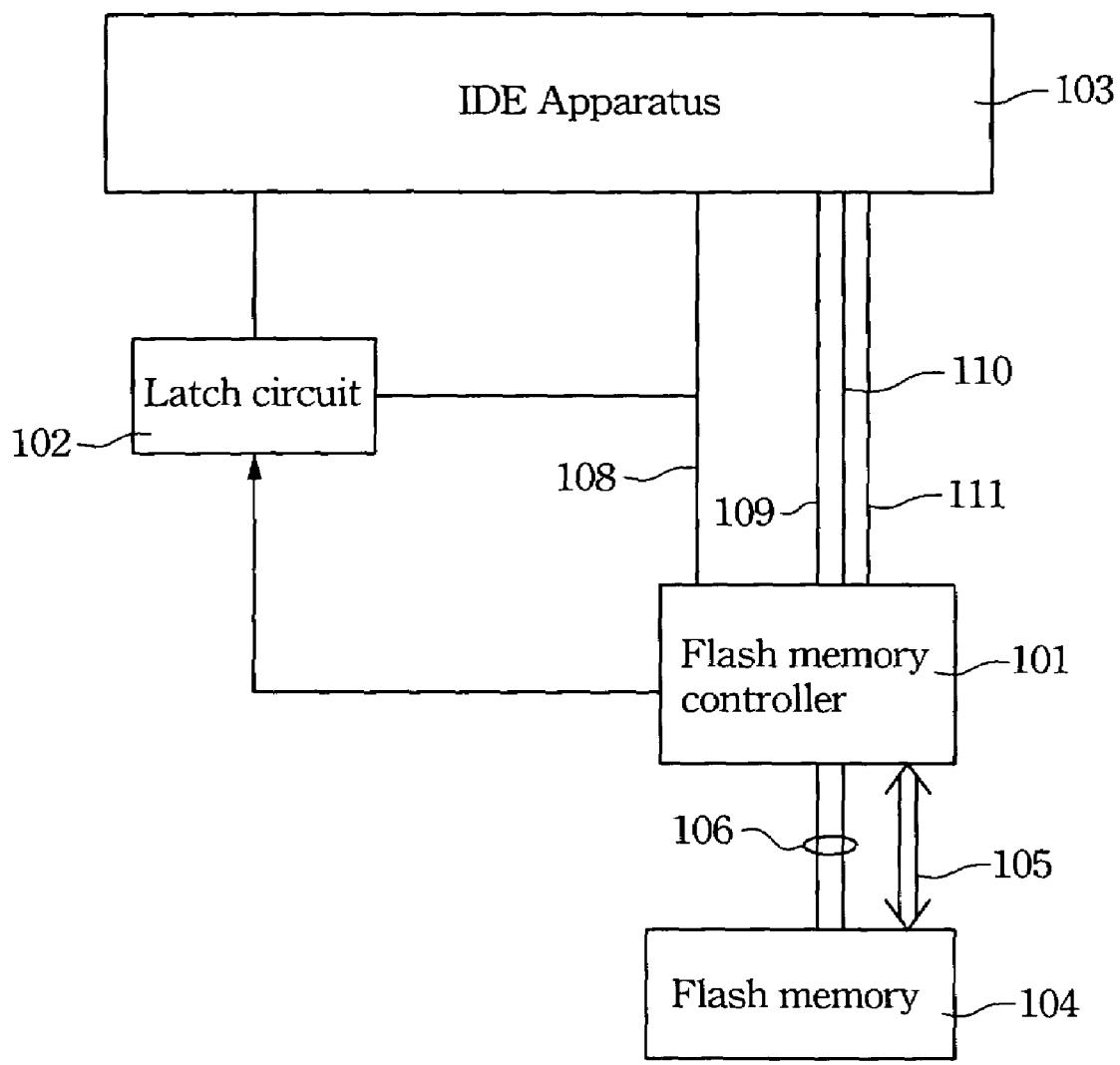
FIG. 1 is an access circuit that can access a flash memory and an IDE apparatus together according to a preferred embodiment of the present invention.

FIG. 1 is a schematic diagram of an access circuit of the present invention. This access circuit 100 includes a flash memory controller 101, a latch circuit 102 and an IDE apparatus 103, such as an IDE memory.

The flash memory controller 101 may access a flash memory 104. The data and the address signal are transferred in a same bus 105 between the flash memory controller 101 and the flash memory 104. The control signals, such as latch signal (ALE), read signal (RD), write signal (WR) and choose signal (CS), are transferred through the control line 106.

The latch signal (ALE) runs out the flash memory controller 104 through the line 107 to control the latch circuit 102. The RD signal, WR signal and the CS signal are lead out through the lines 109, 110 and 111, respectively to control the IDE apparatus 103. The data and the address signals transferred from the flash memory 104 to the flash memory controller 101 through the bus 105 are sent to the latch circuit 102 and the IDE apparatus 103.

When the latch signal transferred in the line 107 from the flash memory controller 104 is enabled, this latch signal can control the latch circuit 102 to access the data and the address signal transferred in the line 108. On the other hand, when the latch signal is disabled, the data and address signal are latched in the latch circuit 102. Moreover, when the RD signal or the WR signal transferred in the line 109 or 110 is enabled, the IDE apparatus 103 is controlled to access the data and address signal transferred in the line 108.

Figure 2:
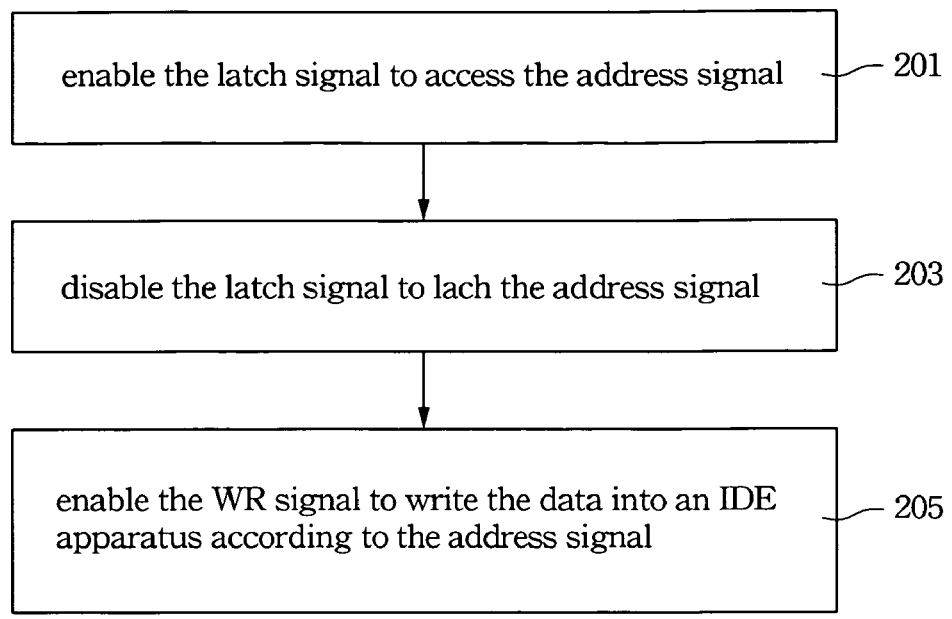
FIG. 2 is a flow chart of writing data to an IDE apparatus according to a preferred embodiment of the present invention.

FIG. 2 is a flow chart of writing data to an IDE apparatus according to a preferred embodiment of the present invention. Reference is again made to FIG. 1. First, in step 201, the latch signal transferred in the line 107 is enabled by the flash memory controller 101 to control the latch circuit to access the address signal of the data and address signals transferred in line 108. Next, in step 203, the latch signal transferred in the line 107 is disabled by the flash memory controller 101 to latch the address signal in the latch circuit 102. Finally, in step 205, the WR signal transferred in the line 110 is enabled by the flash memory controller 101 to write the data transferred in the line 108 into the IDE apparatus 103 according to the address signal latched in the latch circuit 102.

Figure 3:
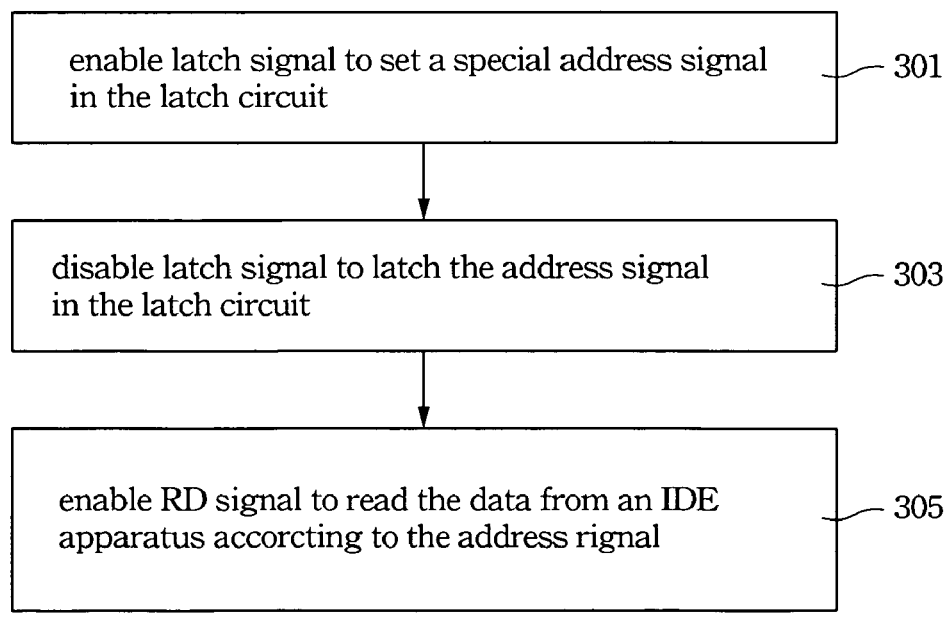
FIG. 3 is a flow chart of reading data from an IDE apparatus according to a preferred embodiment of the present invention.

FIG. 3 is a flow chart of reading a data from an IDE apparatus according to a preferred embodiment of the present invention. Reference is again made to FIG. 1. When reading data form an IDE apparatus, the data is read from a special address, such as address 0. Therefore, in step 301, when the latch signal transferred in the line 107 is enabled by the flash memory controller 101, the flash memory controller 101 sets the special address signal, address 0, in the latch circuit 102. Next, in step 303, the latch signal transferred in the line 107 is disabled by the flash memory controller 101 to latch the address 0 in the latch circuit 102. Finally, in step 305, the RD signal transferred in the line 109 is enabled by the flash memory controller 101 to read the data from the IDE apparatus 103 according to the address latched in the latch circuit 102. Then, the data is stored in the flash memory 104.

Alternatively, in a flash memory, the data can be accessed in a page increments, where the size of a page is 512 Bytes. When accessing page data, the operation steps shown in FIG. 2 or FIG. 3 has to be repeated. Such operation method costs a lot of time in redundant steps. Therefore, the present invention provides a direct memory access (DMA) method for an IDE apparatus. Reference is again made to FIG. 1. First, conditions in a firmware are set. The clock signals for accessing the IDE apparatus 103 and accessing the flash memory 104 are set to be the same. The main purpose is to make the two memories have the same access clock. A special access count, such as 512 times, and a special access address, such as address 0, are set for accessing data.

After these conditions are set to the firmware, when a page data is required to be accessed, a latch signal transferred in the line 107 is enabled by the flash memory controller 101 for setting the special address signal in the latch circuit 102. Next, the latch signal is disabled by the flash memory controller 101 to latch the special address signal in the latch circuit 102. Finally, the flash memory controller 101 can access the IDE apparatus 103 according to the set access count and the access address.

Accordingly, the access circuit of the present invention can be used to access the flash memory and the IDE apparatus concurrently, thereby reducing cost of the electrical device by simplifying it. Moreover, the access circuit can support the direct memory access (DMA) method to access the flash memory and the IDE apparatus, thereby increasing access efficiency.

As is understood by a person skilled in the art, the foregoing descriptions of the preferred embodiment of the present invention are an illustration of the present invention rather than a limitation thereof. Various modifications and similar arrangements are included within the spirit and scope of the appended claims. The scope of the claims should be accorded to the broadest interpretation so as to encompass all such modifications and similar structures. While preferred embodiments of the invention have been illustrated and described, it will be appreciated that various changes can be made therein without departing from the spirit and scope of the invention.

What is claimed is:

1. A flash memory circuit, wherein said circuit access an IDE apparatus, comprising:
    a flash memory controller for outputting a latch signal, a writing signal, a reading signal and a data, wherein said flash memory controller comprises a firmware, said firmware sets a clock signal for accessing said IDE apparatus equal to clock signal of said flash memory, and sets a special access count and a special access address;
    a latch circuit controlled by said latch signal, wherein said latch signal controls said latch circuit to access a special address, and said special address is latched in said latch circuit; and
    an IDE apparatus controlled by said writing signal or said reading signal, wherein said writing signal controls said IDE apparatus for writing said data to said IDE apparatus according to said special address, and said reading signal controls said IDE apparatus for reading said data from said IDE apparatus according to said special address.

2. The flash memory circuit of claim 1, wherein said special address is indicated by said data.

3. The flash memory circuit of claim 1, wherein when said latch signal is enabled, said special address is set in said latch circuit.

4. The flash memory circuit of claim 1, wherein when said latch signal is disabled, said special address is latched in said latch circuit.

5. The flash memory circuit of claim 1, wherein said IDE apparatus is an IDE memory.

6. The flash memory circuit of claim 1, wherein said special address is address 0.

7. The flash memory circuit of claim 1, wherein said flash memory controller is a NAND-type flash memory controller.

8. The flash memory circuit of claim 1, wherein said special address is address 0.

9. The flash memory circuit of claim 1 wherein said special access count is 512 times.

10. The flash memory circuit of claim 1, wherein when writing of said data volume is larger than a special volume, said flash memory controller enable said writing signal to write data into said IDE apparatus according to said special address and said special access count.

11. The flash memory circuit of claim 10, wherein said special volume is 512 bytes.

12. The flash memory circuit of claim 1 wherein reading of said data volume is larger than a special volume, said flash memory controller enable said reading signal to read data from said IDE apparatus according to said special address and said special access count.

13. The flash memory circuit of claim 12, wherein said special volume is 512 bytes.

14. A method for accessing data from an IDE apparatus, wherein a flash memory circuit is used in said method, said flash memory circuit includes a flash memory controller for outputting a latch signal and an accessing signal, a firmware and a latch circuit coupling with said IDE apparatus, comprising:
    setting a clock signal of accessing said IDE apparatus equal to a clock signal of said flash memory by said firmware;
    setting a special access address by said firmware;
    setting a special access count by said firmware;
    enabling said latch signal to access a special address;
    disabling said latch signal to latch said special address in said latch circuit; and
    enabling said accessing signal to access said data from said IDE apparatus according to said special address and said special access count.

15. The method of claim 14, wherein said special address is address 0.

16. The method of claim 14, wherein said access count is 512 times.

* * * * *